US011289649B2

(12) United States Patent
Leong et al.

(10) Patent No.: US 11,289,649 B2
(45) Date of Patent: Mar. 29, 2022

(54) NON-VOLATILE MEMORY ELEMENTS WITH A NARROWED ELECTRODE

(71) Applicant: GLOBALFOUNDRIES Singapore Pte. Ltd., Singapore (SG)

(72) Inventors: Lup San Leong, Singapore (SG); Curtis Chun-I Hsieh, Singapore (SG); Juan Boon Tan, Singapore (SG); Eng Huat Toh, Singapore (SG); Kin Wai Tang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/846,940

(22) Filed: Apr. 13, 2020

(65) Prior Publication Data
US 2021/0320249 A1 Oct. 14, 2021

(51) Int. Cl.
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/122* (2013.01); *H01L 45/1691* (2013.01)

(58) Field of Classification Search
None
See application file for complete search history.

(56) References Cited

U.S. PATENT DOCUMENTS

| 6,791,102 | B2* | 9/2004 | Johnson | H01L 45/06 257/3 |
| 7,772,581 | B2* | 8/2010 | Lung | H01L 45/126 257/3 |
| 10,003,022 | B2 | 6/2018 | Liu et al. | |
| 2006/0118913 | A1* | 6/2006 | Yi | H01L 45/144 257/613 |
| 2006/0237756 | A1* | 10/2006 | Park | H01L 27/2409 257/296 |
| 2006/0289848 | A1* | 12/2006 | Dennison | H01L 45/06 257/3 |
| 2007/0007613 | A1* | 1/2007 | Wang | H01L 45/1675 257/467 |
| 2007/0040159 | A1* | 2/2007 | Wang | H01L 45/06 257/3 |

(Continued)

OTHER PUBLICATIONS

Williams et al., "Etch Rates for Micromachining Processing—Part II", Journal of Microelectromechanical Systems, vol. 12, No. 6, Dec. 2003.

(Continued)

*Primary Examiner* — Andres Munoz
(74) *Attorney, Agent, or Firm* — Thompson Hine LLP

(57) ABSTRACT

Structures for a non-volatile memory element and methods of forming a structure for a non-volatile memory element. A switching layer is positioned over a first electrode, and a dielectric layer is positioned over the switching layer. The dielectric layer includes an opening extending to the switching layer. A second electrode includes a portion in the opening in the dielectric layer. The portion of the second electrode is in contact with a first portion of the switching layer. The switching layer further includes a second portion positioned between the dielectric layer and the first electrode.

20 Claims, 8 Drawing Sheets

(56) References Cited

U.S. PATENT DOCUMENTS

2009/0239334 A1* 9/2009 Breitwisch ............. H01L 45/16
438/102

OTHER PUBLICATIONS

Zhao et al., "Multi-silicon ridge nanofabrication by repeated edge lithography", IOP Publishing, Nanotechnology 20 (2009) 315305 (7pp).
Sriraman et al., "HfO2 Based Resistive Switching Non-Volatile Memory (RRAM) and Its Potential for Embedded Applications", 2012 International Conference on Solid-State and Integrated Circuit (ICSIC 2012), IPCSIT vol. 32 (2012).
Curtis Chun-I Hsieh et al., "RRAM Device and Method of Fabrication Thereof", filed Oct. 22, 2018 as U.S. Appl. No. 16/166,827.

* cited by examiner

NON-VOLATILE MEMORY ELEMENTS WITH A NARROWED ELECTRODE

BACKGROUND

The present invention relates to integrated circuits and semiconductor device fabrication and, more specifically, to structures for a non-volatile memory element and methods of forming a structure for a non-volatile memory element.

A resistive random-access memory (RRAM) device provides one type of embedded non-volatile memory technology. Because the memory elements of the resistive random-access memory device are non-volatile, stored bits of data are retained by a resistive random-access memory device even if the memory elements are unpowered. The non-volatility of a resistive random-access memory device contrasts with volatile memory technologies, such as a static random-access memory (SRAM) device in which the stored bits of data are eventually lost when unpowered and a dynamic random-access memory (DRAM) device in which the stored bits of data are lost if not periodically refreshed.

Data is stored in a resistive random-access memory element by changing the resistance across a switching layer to provide different information-storage states—a high-resistance state and a low-resistance state—representing the stored bits of data. The switching layer can be modified to conduct through one or more filaments or conductive paths that are generated by applying a sufficiently high voltage across the switching layer. The filaments of the resistive random-access memory element are created or destroyed in order to respectively program the low-resistance state or the high-resistance state.

The switching layer of a resistive random-access memory element is positioned between a bottom electrode and a top electrode. The resistive random-access memory element is formed by depositing a layer stack and then patterning the layer stack with lithography and reactive ion etching processes to successively shape the top electrode, the switching layer, and the bottom electrode. The reactive ion etching process includes a plasma component with energetic ions that can cause sputtering and redeposition of sputtered material, and that may damage the materials of the different layers.

Improved structures for a non-volatile memory element and methods of forming a structure for a non-volatile memory element are needed.

SUMMARY

According to an embodiment of the invention, a structure for a non-volatile memory element is provided. The structure includes a first electrode, a switching layer positioned over the first electrode, and a dielectric layer positioned over the switching layer. The dielectric layer includes an opening extending to a first portion of the switching layer. A second electrode includes a portion in the opening in the dielectric layer. The portion of the second electrode is in contact with the first portion of the switching layer. The switching layer further includes a second portion positioned between the dielectric layer and the first electrode.

According to another embodiment of the invention, a method of forming a structure for a non-volatile memory element is provided. The method includes depositing a first electrode layer, depositing a switching layer over the first electrode layer, depositing a dielectric layer over the switching layer, forming an opening in the dielectric layer that extends to a portion of the switching layer, and forming a second electrode including a portion in the opening in the dielectric layer. The portion of the second electrode is in contact with a first portion of the switching layer, and the switching layer includes a second portion positioned between the dielectric layer and the first electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 1A is a top view of the structure of FIG. 1 in which FIG. 1 is taken generally along line 1-1.

DETAILED DESCRIPTION

Figure 1:
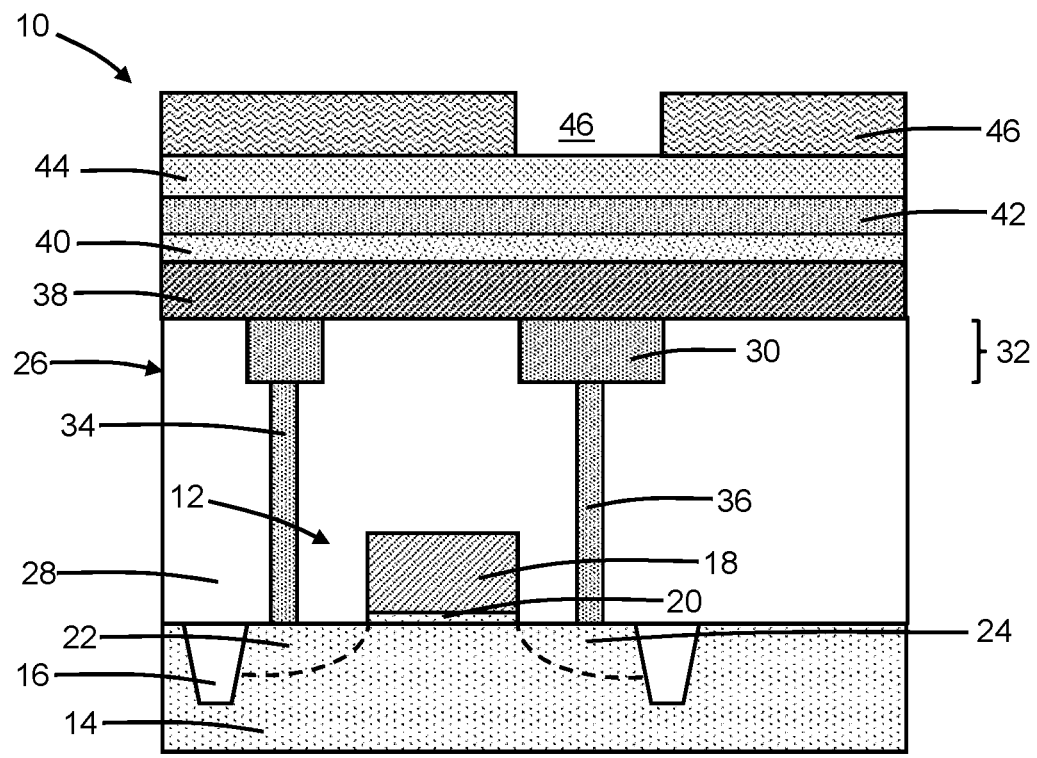
FIG. 1 is a cross-sectional view of a structure at an initial fabrication stage of a processing method in accordance with embodiments of the invention.
Figure 1A:
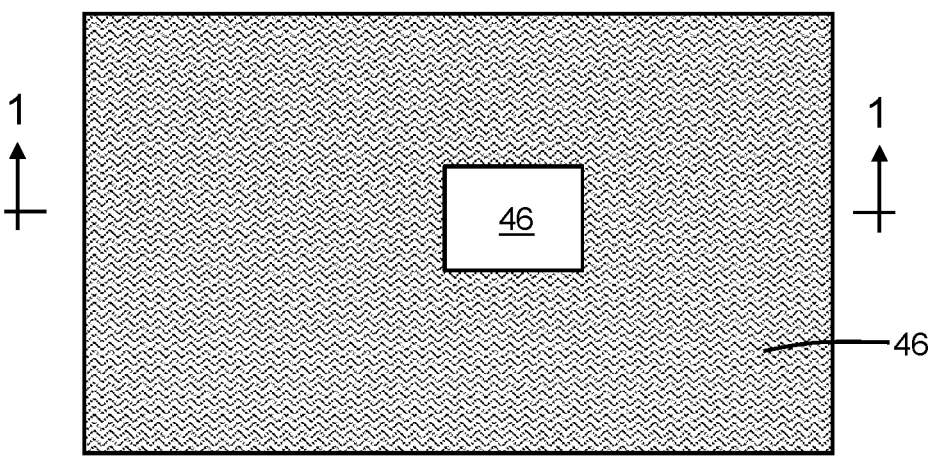

With reference to FIGS. 1, 1A and in accordance with embodiments of the invention, a structure 10 includes a field-effect transistor 12 that provides an access transistor to a subsequently-formed non-volatile memory element. The field-effect transistor 12 may be fabricated by front-end-of-line (FEOL) processing using a substrate 14 that is composed of a single-crystal semiconductor material, such as single-crystal silicon. Shallow trench isolation regions 16, which may be composed of a dielectric material such as silicon dioxide, may be formed in trenches that are patterned in the substrate 14. The shallow trench isolation regions 16 surround an active region of the substrate 14 in which the field-effect transistor 12 is formed.

The field-effect transistor 12 may include a gate electrode 18, a gate dielectric layer 20, a source region 22, and a drain region 24. The gate electrode 18 may be composed of a heavily-doped polysilicon layer that is deposited and patterned with lithography and etching processes, and the gate dielectric layer 20 may be composed of silicon dioxide that is patterned along with the heavily-doped polysilicon layer. Alternatively, the gate electrode 18 may be a metal gate formed by a gate-first process or a replacement gate process, and the gate dielectric layer 20 may be composed of a high-k dielectric material. The source region 22 and drain region 24 may be doped regions that are located in the substrate 14. The source region 22 and drain region 24 may be doped with an n-type dopant (e.g., phosphorus and/or arsenic) that provides n-type conductivity or, alternatively, may be doped with a p-type dopant (e.g., boron) that provides p-type conductivity. Instead of having the representative planar design, the field-effect transistor 12 may be a fin-type field-effect transistor, a gate-all-around field-effect transistor, etc.

An interconnect structure 26 is formed over the field-effect transistor 12 by middle-of-line processing and back-end-of-line processing, which includes formation of contacts, vias, and wiring that is coupled with the field-effect transistor 12. The interconnect structure 26 includes one or more interlayer dielectric layers 28, a metal feature 30 in a metallization level 32, and interconnections, such as interconnections 34, 36, having one or more metal islands, vias, and/or contacts arranged as metal features in the one or more interlayer dielectric layers 28. The one or more interlayer dielectric layers 28 may be composed of a dielectric material, such as carbon-doped silicon dioxide, the metal feature 30 may be composed of copper, and the interconnections 34, 36 may be composed of one or more metals, such as copper, tungsten, and/or a metal silicide.

A bottom electrode layer 38 is formed over the metallization level 32. A portion of the bottom electrode layer 38 is in direct contact with the metal feature 30. A resistive layer 40 is formed over the bottom electrode layer 38. Dielectric layers 42, 44 are formed over the resistive layer 40. The resistive layer 40 is fully positioned between the bottom electrode layer 38 and the dielectric layer 42. The resistive layer 40 is planar in that its top surface (having an interface with the dielectric layer 42) is planar or flat and its bottom surface (having an interface with the bottom electrode layer 38) is planar or flat. The dielectric layer 42 may directly contact the resistive layer 40, and the dielectric layer 44 may directly contact the dielectric layer 42.

The bottom electrode layer 38 may be composed of a metal, such as ruthenium, platinum, titanium nitride, or tantalum nitride, deposited by physical vapor deposition. The resistive layer 40 may be composed of a dielectric material, such as silicon dioxide, silicon nitride, or a metal oxide (e.g., magnesium oxide, tantalum oxide, hafnium oxide, titanium oxide, or aluminum oxide), deposited by chemical vapor deposition or atomic layer deposition. The dielectric layer 42 may be composed of dielectric material, such as silicon nitride, deposited by chemical vapor deposition or atomic layer deposition. The dielectric layer 44 may be composed of dielectric material, such as silicon dioxide, deposited by chemical vapor deposition or atomic layer deposition. In an embodiment, the dielectric layer 44 may be composed of silicon dioxide deposited by chemical vapor deposition using tetraethylorthosilicate (TEOS) as a reactant.

An etch mask 46 is formed over the dielectric layer 44. The etch mask 46 may include a layer of a photoresist that is applied by a spin-coating process, pre-baked, exposed to light projected through a photomask, baked after exposure, and developed with a chemical developer to define an opening 48. The opening 48 is generally aligned with the metal feature 30.

Figure 2:
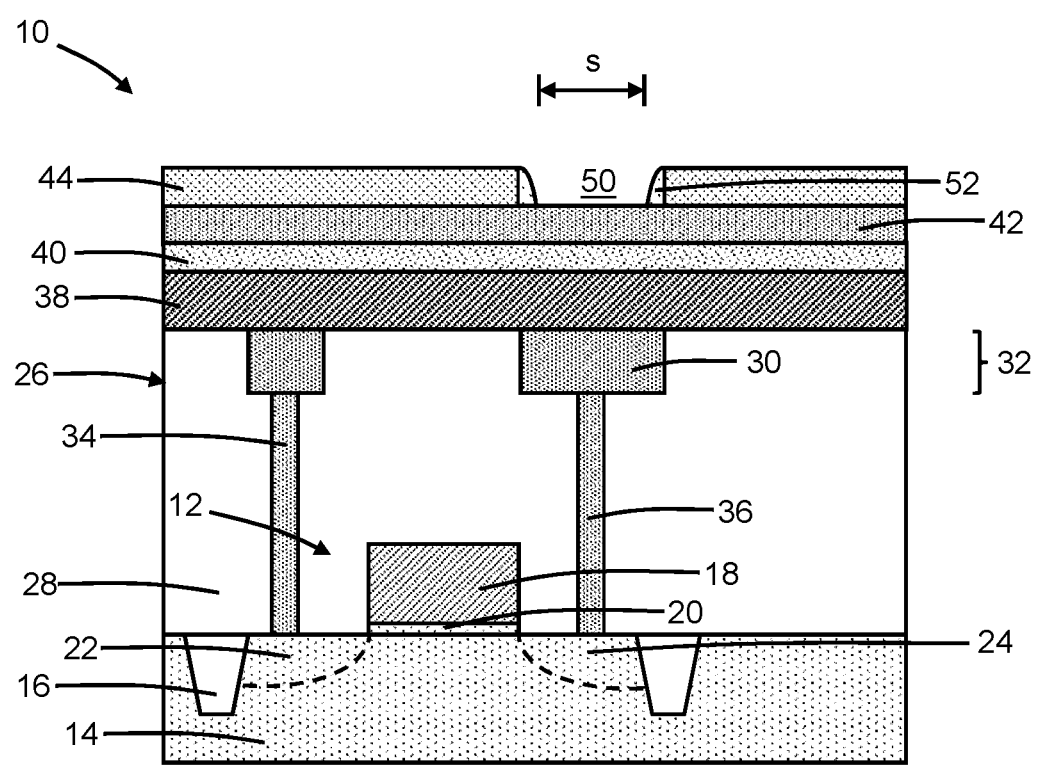
FIGS. 2-5 are cross-sectional views of the structure at successive fabrication stages subsequent to FIG. 1.

With reference to FIG. 2 in which like reference numerals refer to like features in FIG. 1 and at a subsequent fabrication stage, an opening 50 is formed in the upper dielectric layer 44 by an etching process with the etch mask 46 (FIG. 2) present. The dielectric layer 44 is etched at the location of the opening 48 in the etch mask 46 to form the opening 50.

The etching process, which may be a reactive ion etching process, removes the material of the dielectric layer 44 selective to the material of the dielectric layer 42, which functions as an etch stop. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. The etch mask 46 is stripped after the opening 50 is formed.

Sidewall spacers 52 are formed on the sidewalls of the dielectric layer 44 inside the opening 50. The sidewall spacers 52 may be formed by depositing a conformal layer of a dielectric material, such as silicon dioxide, and etching the deposited conformal layer with an anisotropic etching process, such as a reactive ion etching process. The etching process removes the material of the conformal layer selective to the material of the dielectric layer 42, which again functions as an etch stop. The spacing, s, inside the lower portion of the opening 50 proximate to the dielectric layer 42 establishes a width dimension of a lower portion of a subsequently-formed top electrode. The curvature of the sidewall spacers 52 establishes a varying width dimension for an upper portion of the subsequently-formed top electrode.

Figure 3:
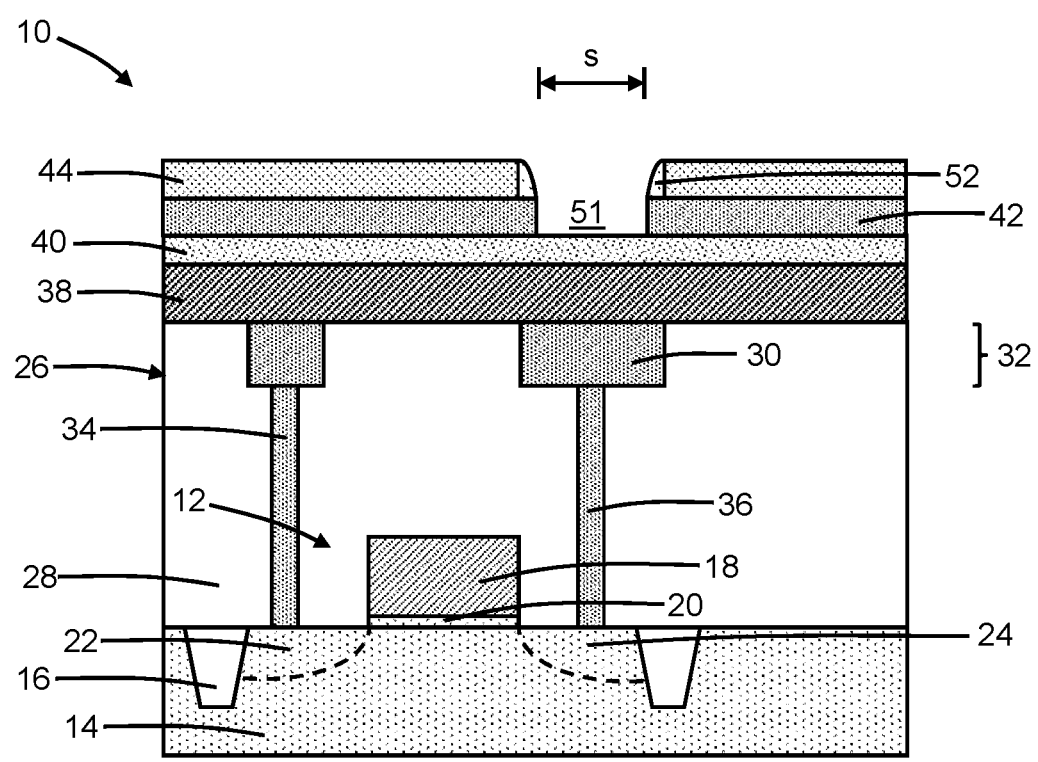

With reference to FIG. 3 in which like reference numerals refer to like features in FIG. 2 and at a subsequent fabrication stage, an opening 51 is formed in the dielectric layer 42 with an etching process. In an embodiment, the etching process is a wet chemical etching process. In an embodiment in which the dielectric layer 42 is composed of silicon nitride, the wet chemical etching process may utilize an etchant solution containing phosphoric acid. The etching process removes the material of the dielectric layer 42 selective to the material of the resistive layer 40. The opening 51 in the dielectric layer 44 is formed at the location of the spacer-clad opening 50 in the dielectric layer 42. The width dimension of the opening 51 in the dielectric layer 42 may be equal or substantially equal to the spacing, s, between the sidewall spacers 52.

Figure 4:
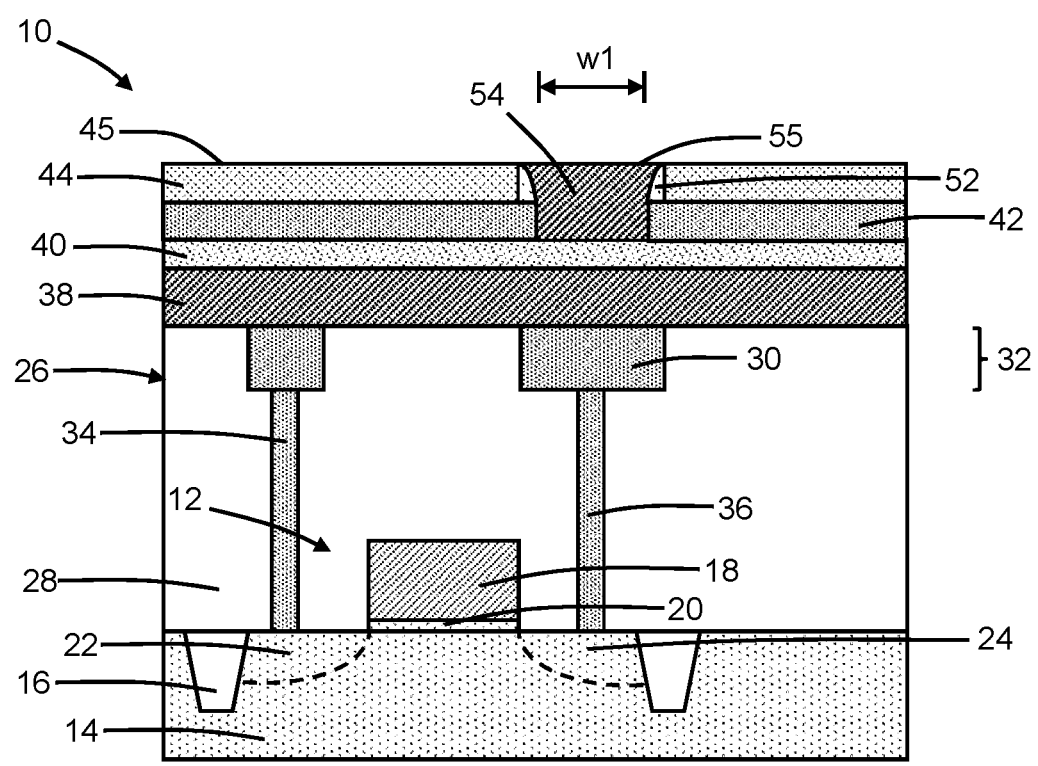

With reference to FIG. 4 in which like reference numerals refer to like features in FIG. 3 and at a subsequent fabrication stage, a top electrode 54 is formed inside the openings 50, 51. The top electrode 54 may be formed by depositing a layer composed of a metal, such as ruthenium, platinum, titanium nitride, or tantalum nitride, and planarizing the deposited layer relative to the top surface of the dielectric layer 44 with chemical-mechanical polishing. The top electrode 54 conforms to the shape of the openings 50, 51 and may be in direct contact at its opposite side surfaces with the sidewall spacers 52 and the sidewalls of the dielectric layer 42 below the sidewall spacers 52. The top electrode 54 may have a top surface 55 that is co-planar or substantially co-planar with a top surface 45 of the dielectric layer 44. The top electrode 54 has an upper portion of a given thickness or height inside the opening 50. The top electrode 54 has a lower portion of a given thickness or height inside the opening 51. The thickness of the upper portion of the top electrode 54 may be equal or substantially equal to the thickness of the dielectric layer 44. The thickness of the lower portion of the top electrode 54 may be equal or substantially equal to the thickness of the dielectric layer 42. The lower portion of the top electrode 54 is in contact with the resistive layer 40. In an embodiment, the lower portion of the top electrode 54 may directly contact the resistive layer 40.

Conventional process flows rely on reactive ion etching to pattern the top electrode. In contrast, the top electrode 54 is formed without the use of reactive ion etching. Instead, the layer used to form the top electrode 54 is deposited inside the registered openings 50, 51 and planarized. The opening 51, which exposes the resistive layer 40, is formed using a wet chemical etching process, and is not formed using reactive ion etching.

The sidewall spacers 52 are positioned between the dielectric layer 44 and the upper portion of the top electrode 54 inside the opening 50 in the dielectric layer 44. The lower portion of the top electrode 54 inside the opening 51 may have a substantially constant width over its height or thickness that is equal to the width dimension, w1. The lower portion of the top electrode 54 may be have a sub-lithographic width dimension that is less than the lithography critical dimension because of the use of the sidewall spacers 53 in forming the opening 51. The sidewall spacers 52 may have a curved shape such that the upper portion of the top electrode 54 inside the opening 50 has a varying width over its height or thickness. The width dimension of the upper portion of the top electrode 54 is narrowest at the interface with the lower portion of the top electrode 54 and widens with increasing distance from the interface. As a result, the upper portion of the top electrode 54 has a width dimension that increases with increasing distance from the lower portion of the top electrode 54. The width dimension of the upper portion of the top electrode 54 has a width dimension that is greater than or equal to the width dimension of the lower portion of the top electrode 54.

Figure 5:
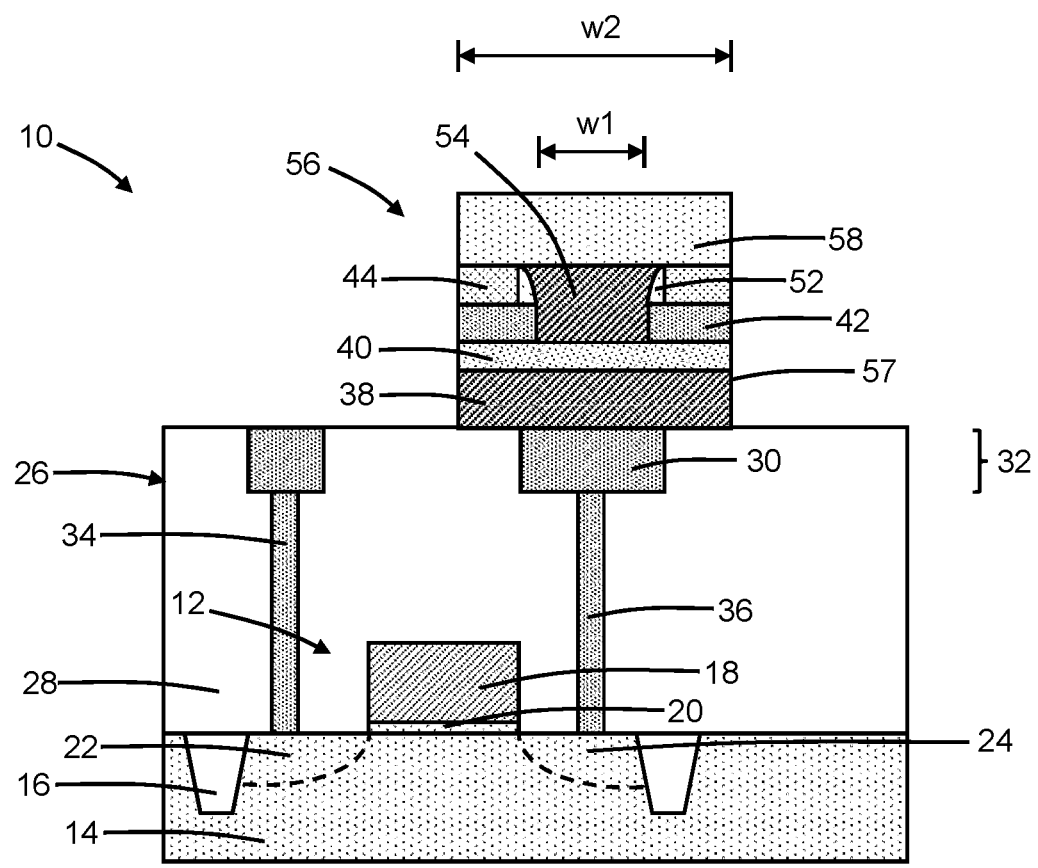

With reference to FIG. 5 in which like reference numerals refer to like features in FIG. 4 and at a subsequent fabrication stage, a non-volatile memory element 56 is formed by depositing a dielectric layer 58 and patterning the layers 38, 40, 42, 44, 58 with lithography and etching processes. The etching process may be a reactive ion etching process. The patterned bottom electrode layer 38 defines a bottom electrode of the non-volatile memory element 56 and the patterned resistive layer 40 defines a switching layer of the non-volatile memory element 56. The top electrode 54 is not patterned by the etching process.

The bottom electrode layer 38, resistive layer 40, and dielectric layers 42, 44 terminate at a side surface or sidewall 57 of the non-volatile memory element 56. The top electrode 54, which is spaced inward from the sidewall 57, is surrounded by the dielectric layers 42, 44 and covered by the dielectric layer 58 during the etching process, which protects the top electrode 54 against exposure to the etching process. The bottom electrode is coupled to the metal feature 30. The width dimension, w1, of the top electrode 54 is less than a width dimension, w2, of the bottom electrode and the resistive layer 40.

Additional metallization levels of the interconnect structure 26 may be formed by back-end-of-line processing over the metallization level 32 and non-volatile memory element 56.

In an alternative embodiment, the non-volatile memory element 56 may be a phase change material (PCM) memory element that include a phase change material as the switching layer. The phase change material may be a chalcogenide glass, such as $Ge_2Sb_2Te_5$, and may be heated to provide an amorphous phase or a crystalline phase that respectively define the high-resistance and low-resistance states.

In an alternative embodiment, the non-volatile memory element 56 may be a magnetic tunnel junction memory element. In that regard, the non-volatile memory element may include a pinned or fixed layer, a tunnel barrier layer, and a free layer that are arranged in a layer stack between the bottom and top electrodes. The fixed layer may include one or more layers, such as a reference layer and a hard layer, that are composed of a magnetic material, such as a cobalt-platinum alloy or a cobalt-iron-boron alloy. The tunnel barrier layer may be composed of a non-magnetic, dielectric material, such as magnesium oxide or aluminum oxide. The free layer may include one or more layers composed of a magnetic alloy, such as a cobalt-iron-boron alloy. The magnetization of the reference layer of the fixed layer is pinned such that the magnetization vector cannot flip (i.e., rotate) under the influence of a programming current. The magnetization of the free layer is not pinned such that the magnetization vector can flip (i.e., rotate) under the influence of a programming current.

Figure 6:
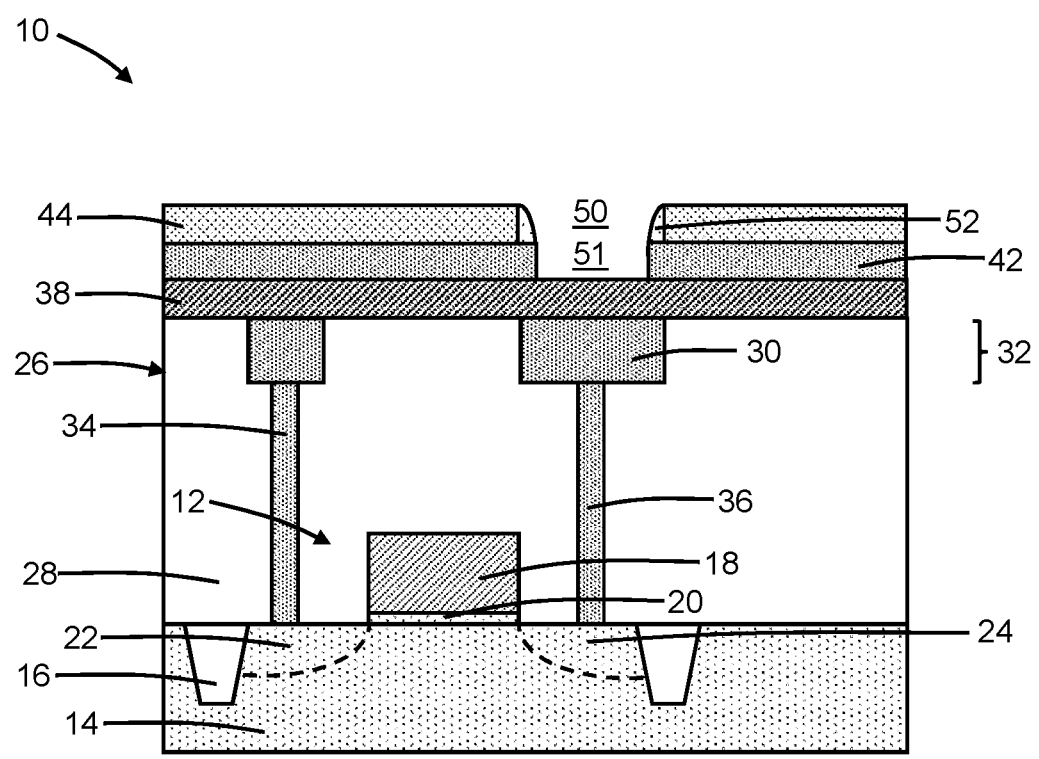
FIGS. 6-8 are cross-sectional views of a structure at successive fabrication stages of a processing method in accordance with alternative embodiments of the invention.

With reference to FIG. 6 in which like reference numerals refer to like features in FIG. 3 and in accordance with alternative embodiments of the invention, the resistive layer 40 may be omitted from the initial layer stack formed over the metallization level 32. As a result of the omission of the resistive layer 40, the dielectric layer 42 is deposited directly on the bottom electrode layer 38. The opening 50 in the upper dielectric layer 44 and sidewall spacers 52 are formed as previously described, and the opening 51 in the dielectric layer 42 is subsequently formed also as previously described. The opening 51 terminates at the bottom electrode layer 38 instead of terminating at the resistive layer, which is not yet deposited.

Figure 7:
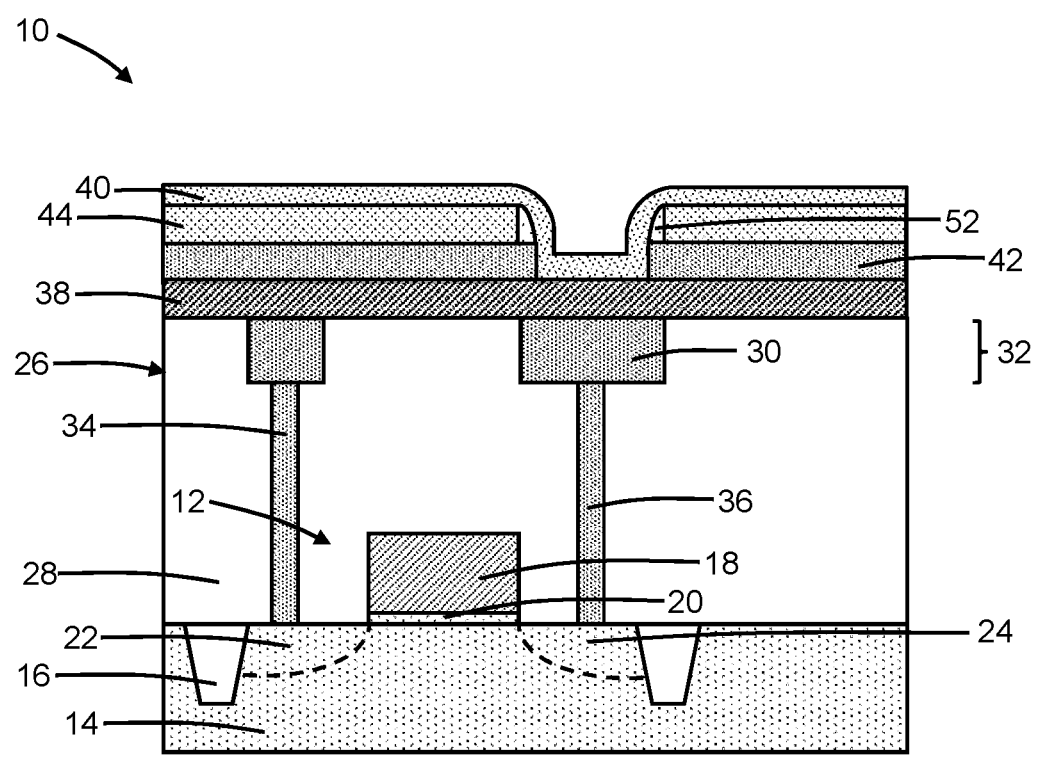

With reference to FIG. 7 in which like reference numerals refer to like features in FIG. 6 and at a subsequent fabrication stage, the resistive layer 40 is deposited over the dielectric layer 44 and inside the openings 50, 51. The portion of the resistive layer 40 inside the opening 50 conforms to the shape of the openings 50 and sidewall spacers 52. The portion of the resistive layer 40 inside the opening 50 directly contacts the bottom electrode layer 38. The resistive layer 40 may have a conformal thickness.

Figure 8:
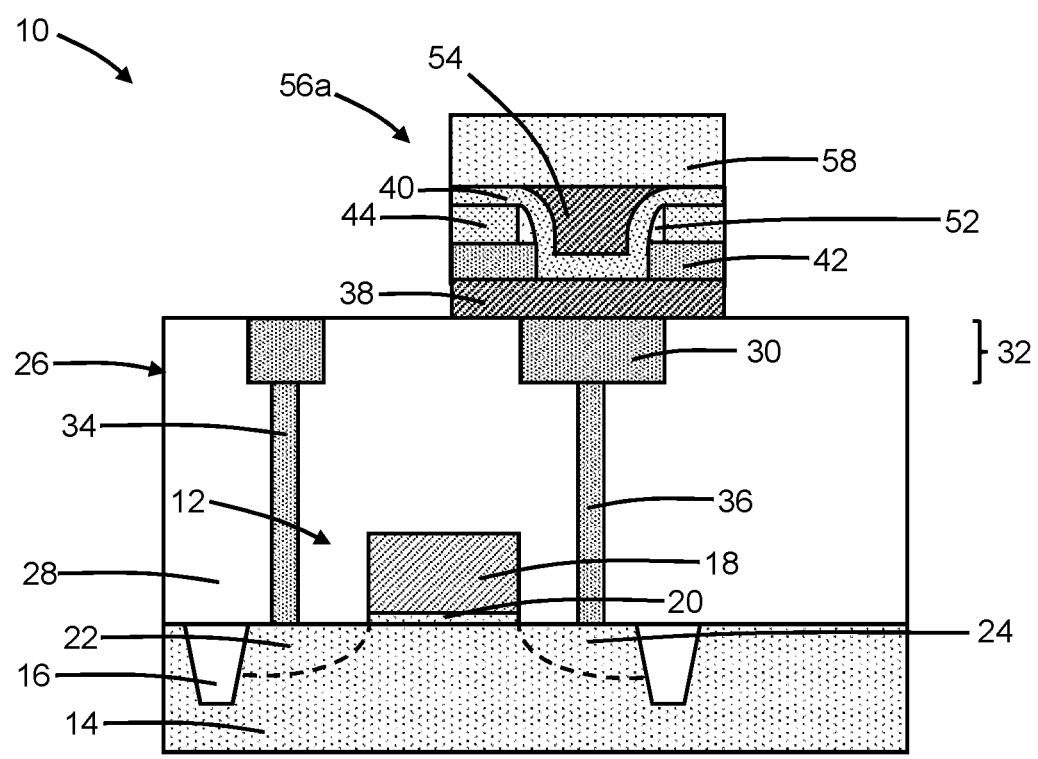

With reference to FIG. 8 in which like reference numerals refer to like features in FIG. 7 and at a subsequent fabrication stage, the top electrode 54 is formed inside the openings 50, 51 after the resistive layer 40 is formed. The top electrode 54 is planarized relative to the resistive layer 40. A portion of the resistive layer 40 is positioned between the top electrode 54 and the bottom electrode layer 38. A non-volatile memory element 56a is formed by depositing the dielectric layer 58 and patterning the layers 38, 40, 42, 44, 58 with lithography and etching processes, as previously described.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a non-volatile memory element, the structure comprising:
    a first electrode;
    a switching layer positioned over the first electrode;
    a first dielectric layer positioned over the switching layer, the first dielectric layer including a first opening extending to a first portion of the switching layer;
    a second dielectric layer positioned over the first dielectric layer, the second dielectric layer including a second opening; and
    a second electrode including a first portion in the first opening in the first dielectric layer and a second portion in the second opening in the second dielectric layer, the first portion of the second electrode in contact with the first portion of the switching layer, the second portion of the second electrode having a variable width inside the second opening, and the variable width increasing with increasing distance from the first portion of the second electrode,
    wherein the switching layer includes a second portion positioned between the first dielectric layer and the first electrode, the first electrode and the switching layer terminate at a surface at a sidewall of the non-volatile memory element, the first dielectric layer extends from the first opening to terminate at the surface at the sidewall of the non-volatile memory element, and the second dielectric layer extends from the second opening to terminate at the surface at the sidewall of the non-volatile memory element.

2. The structure of claim 1 further comprising:
    a first sidewall spacer inside the second opening; and
    a second sidewall spacer inside the second opening,
    wherein the second portion of the second electrode is laterally positioned between the first sidewall spacer and the second sidewall spacer.

3. The structure of claim 1 wherein the first portion of the second electrode has a first width dimension, and the second portion of the second electrode has a second width dimension that is greater than or equal to the first width dimension.

4. The structure of claim 1 wherein the second dielectric layer has a top surface, and the second portion of the second electrode has a top surface that is substantially co-planar with the top surface of the second dielectric layer.

5. The structure of claim 1 wherein the first portion of the second electrode has a first width dimension, and the switching layer has a second width dimension that is greater than the first width dimension.

6. The structure of claim 5 wherein the first electrode has a third width dimension that is greater than the first width dimension.

7. The structure of claim 1 wherein the first portion of the second electrode has a first width dimension, and the first electrode has a second width dimension that is greater than the first width dimension.

8. The structure of claim 1 wherein the switching layer is comprised of a resistive material.

9. The structure of claim 1 wherein the first dielectric layer has a first thickness, and the second electrode has a second thickness that is greater than the first thickness.

10. The structure of claim 1 wherein the first portion and the second portion of the switching layer are planar.

11. The structure of claim 1 wherein the switching layer is comprised of a metal oxide.

12. The structure of claim 11 wherein the first electrode and the second electrode are comprised of ruthenium, platinum, titanium nitride, or tantalum nitride, the first dielectric layer is comprised of silicon nitride, and the second dielectric layer is comprised of silicon dioxide.

13. A structure for a non-volatile memory element, the structure comprising:
    a first electrode;
    a switching layer positioned over the first electrode;
    a first dielectric layer positioned over the switching layer, the first dielectric layer including a first opening extending to a first portion of the switching layer;
    a second dielectric layer positioned over the first dielectric layer, the second dielectric layer including a second opening;
    a second electrode including a first portion in the first opening in the first dielectric layer and a second portion in the second opening in the second dielectric layer, the first portion of the second electrode in contact with the first portion of the switching layer, the second portion of the second electrode having a variable width inside the second opening, and the variable width increasing with increasing distance from the first portion of the second electrode; and
    a metallization level including a metal feature,
    wherein the first electrode is positioned in direct contact with the metal feature, the switching layer includes a second portion positioned between the first dielectric layer and the first electrode, the first electrode and the switching layer terminate at a surface at the sidewall of the non-volatile memory element, the first dielectric layer extends from the first opening to terminate at the surface at the sidewall of the non-volatile memory element, and the second dielectric layer extends from the second opening to terminate at the surface at a sidewall of the non-volatile memory element.

14. The structure of claim 13 wherein the switching layer is comprised of a metal oxide.

15. The structure of claim 14 wherein the first electrode and the second electrode are comprised of ruthenium, platinum, titanium nitride, or tantalum nitride, the first dielectric layer is comprised of silicon nitride, and the second dielectric layer is comprised of silicon dioxide.

16. The structure of claim 13 wherein the first portion of the second electrode has a first width dimension, and the second portion of the second electrode has a second width dimension that is greater than or equal to the first width dimension.

17. The structure of claim 13 wherein the first dielectric layer has a first thickness, and the second electrode has a second thickness that is greater than the first thickness.

18. A method of forming a structure for a non-volatile memory element, the method comprising:
    depositing a first electrode layer;
    depositing a switching layer over the first electrode layer;
    depositing a first dielectric layer over the switching layer;
    depositing a second dielectric layer over the first dielectric layer;
    forming a first opening in the first dielectric layer and a second opening in the second dielectric layer that extend to a first portion of the switching layer;
    forming a second electrode including a first portion in the first opening in the first dielectric layer and a second portion in the second opening in the second dielectric layer; and
    patterning the first dielectric layer, the second dielectric layer, the switching layer, and the first electrode layer to define a sidewall of the non-volatile memory element,
    wherein the first portion of the second electrode is in contact with the first portion of the switching layer, the switching layer includes a second portion positioned between the first dielectric layer and the first electrode layer, the second portion of the second electrode has a variable width inside the second opening, the variable width increases with increasing distance from the first portion of the second electrode, the first electrode layer and the switching layer terminate at a surface at the sidewall of the non-volatile memory element, the first dielectric layer extends from the first opening to terminate at the surface at the sidewall of the non-volatile memory element, and the second dielectric layer extends from the second opening to terminate at the surface at the sidewall of the non-volatile memory element.

19. The method of claim 18 further comprising:
    forming a first sidewall spacer and a second sidewall spacer inside the second opening,
    wherein the second portion of the second electrode is positioned between the first sidewall spacer and the second sidewall spacer.

20. The method of claim 18 wherein the second electrode is formed without using reactive ion etching.

* * * * *